United States Patent
Fornara et al.

(10) Patent No.: US 9,127,994 B2
(45) Date of Patent: Sep. 8, 2015

(54) METHOD OF COMPENSATING FOR EFFECTS OF MECHANICAL STRESSES IN A MICROCIRCUIT

(71) Applicant: STMicroelectronics (Rousset) SAS, Rousset (FR)

(72) Inventors: Pascal Fornara, Pourrieres (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 8 days.

(21) Appl. No.: 13/953,571

(22) Filed: Jul. 29, 2013

(65) Prior Publication Data

US 2014/0026670 A1 Jan. 30, 2014

(30) Foreign Application Priority Data

Jul. 30, 2012 (FR) ...................................... 12 57356

(51) Int. Cl.
*G01L 1/00* (2006.01)
*H01L 29/66* (2006.01)
*G01L 1/14* (2006.01)
*G01L 11/00* (2006.01)
(Continued)

(52) U.S. Cl.
CPC . *G01L 1/005* (2013.01); *G01L 1/00* (2013.01); *G01L 1/148* (2013.01); *H01L 29/66007* (2013.01); *G01L 1/225* (2013.01); *G01L 1/2293* (2013.01); *G01L 11/00* (2013.01); *G01L 25/00* (2013.01); *H01L 27/06* (2013.01)

(58) Field of Classification Search
CPC ....... G01L 1/005; G01L 1/2293; G01L 1/225; G01L 1/26; G01L 1/148; G01L 5/0047; H01L 29/84; H01L 29/66007; H01L 27/06

USPC .............................. 73/774, 777, 763; 438/550
See application file for complete search history.

(56) References Cited

U.S. PATENT DOCUMENTS 6,906,514 B2   6/2005   Ausserlechner
7,255,010 B2 *  8/2007   Ausserlechner ................ 73/777
(Continued)

FOREIGN PATENT DOCUMENTS

WO   2012/013977 A   2/2012

OTHER PUBLICATIONS

Smith, C. S., "Piezoresistance Effect in Germanium and Silicon," Physical Review 94(1):42-49, Apr. 1, 1954.
(Continued)

*Primary Examiner* — Lisa Caputo
*Assistant Examiner* — Jonathan Dunlap
(74) *Attorney, Agent, or Firm* — Seed IP Law Group PLLC

(57) ABSTRACT

A method for manufacturing an integrated circuit includes forming in a substrate a measuring circuit sensitive to mechanical stresses and configured to supply a measurement signal representative of mechanical stresses exerted on the measuring circuit. The measuring circuit is positioned such that the measurement signal is also representative of mechanical stresses exerted on a functional circuit of the integrated circuit. A method of using the integrated circuit includes determining from the measurement signal the value of a parameter of the functional circuit predicted to mitigate an impact of the variation in mechanical stresses on the operation of the functional circuit, and supplying the functional circuit with the determined value of the parameter.

32 Claims, 5 Drawing Sheets

(51) Int. Cl.
  *G01L 1/22* (2006.01)
  *H01L 27/06* (2006.01)
  *G01L 25/00* (2006.01)

(56) References Cited

U.S. PATENT DOCUMENTS

| | | | |
|---|---|---|---|
| 7,353,712 B2* | 4/2008 | Ausserlechner | 73/777 |
| 7,429,498 B2* | 9/2008 | Ausserlechner | 438/106 |
| 7,980,138 B2* | 7/2011 | Ausserlechner | 73/763 |
| 2005/0045879 A1* | 3/2005 | Ausserlechner | 324/763 |
| 2006/0286688 A1* | 12/2006 | Ausserlechner | 257/414 |
| 2007/0063309 A1* | 3/2007 | Ausserlechner | 257/528 |
| 2009/0108839 A1* | 4/2009 | Ausserlechner | 324/251 |
| 2012/0210800 A1* | 8/2012 | Huber et al. | 73/777 |
| 2014/0009221 A1* | 1/2014 | Motz et al. | 327/564 |

OTHER PUBLICATIONS

Kanda, Y., "A Graphical Representation of the Piezoresistance Coefficients in Silicon," IEEE Transactions on Electron Devices ED-29(1):64-70, Jan. 1982.

Jaeger, R. C. et al., "CMOS Stress Sensors on (100) Silicon," IEEE Journal of Solid-State Circuits 35(1):85-95, Jan. 2000.

* cited by examiner

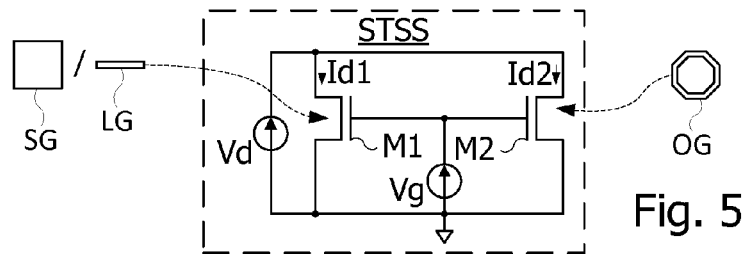
Fig. 5
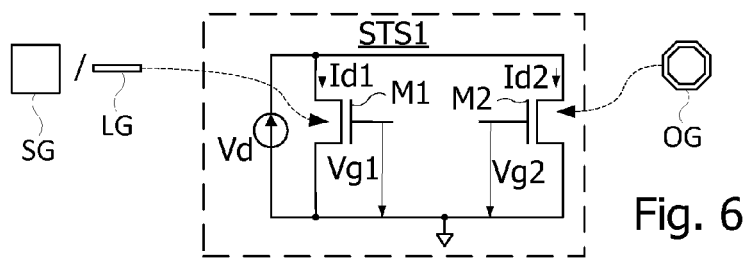
Fig. 6
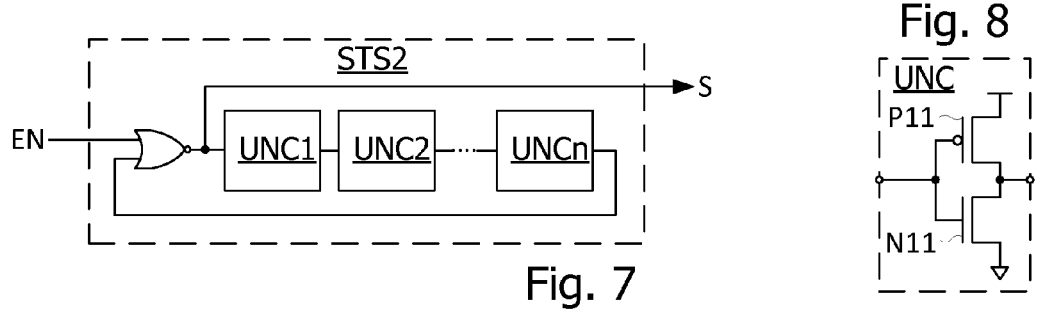
Fig. 7
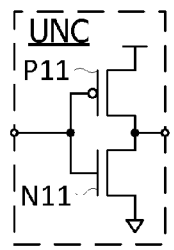
Fig. 8
Fig. 9
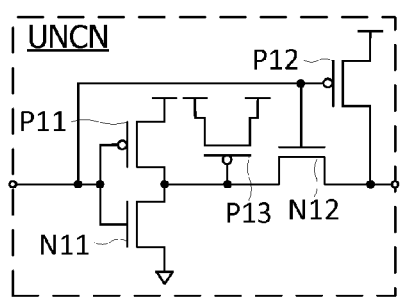
Fig. 10
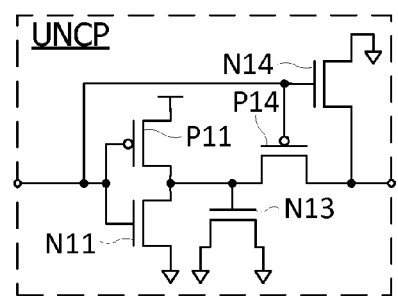

METHOD OF COMPENSATING FOR EFFECTS OF MECHANICAL STRESSES IN A MICROCIRCUIT

BACKGROUND

1. Technical Field

The present disclosure relates to integrated circuits, and more particularly to compensating for drifts in operating parameters of integrated circuits caused by mechanical stress.

2. Description of the Related Art

Indeed, during manufacturing, integrated circuits undergo numerous successive mechanical stresses. Integrated circuits undergo direct mechanical actions, particularly when cutting the wafer to individualize the circuits and packaging the circuit. Integrated circuits undergo indirect mechanical actions under the effect of significant temperature variations. Due to the composite structure, integrated circuits are subjected to mechanical stresses of differential expansions. The package of the integrated circuit also exerts mechanical stresses on the circuit which can vary particularly according to the ambient temperature and the age of the circuit.

When in use, integrated circuits can also undergo temperature variations. Furthermore, under the effect of aging, the mechanical properties of the materials constituting integrated circuits can change, further leading to variations in mechanical stresses. This is particularly the case of the materials constituting the packages of integrated circuit.

BRIEF SUMMARY

Some embodiments relate to a method of manufacture comprising: forming in an integrated circuit a measuring circuit sensitive to mechanical stresses and configured to supply a measurement signal representative of mechanical stresses exerted on the measuring circuit.

According to one embodiment, a method of operation comprises a comparison step for comparing measurements obtained from components of the measuring circuit having different sensitivities to mechanical stresses, and comparable sensitivities to variations in the ambient temperature, to supply a measurement representative of mechanical stresses exerted on the measuring circuit, while being substantially insensitive to variations in the ambient temperature.

Some embodiments also relate to a method for controlling an integrated circuit, comprising steps of: executing a measurement step using measuring circuit formed in a position of the integrated circuit such that the measurement signal is also representative of mechanical stresses exerted on a functional circuit of the integrated circuit, determining from the measurement signal the value of a parameter of the functional circuit, to mitigate an impact of the variation in mechanical stresses on the operation of the functional circuit, and supplying the functional circuit with the value of the parameter.

According to one embodiment, the method comprises a step of selecting in a table the value of the parameter, according to the measurement signal.

According to one embodiment, the method comprises a step of converting the measurement signal into a value likely to address the table.

According to one embodiment, the method comprises steps of comparing each measurement with extreme values, and if the measurement is not between the extreme values, of activating a signal.

According to one embodiment, the method comprises steps of determining a variation rate between two measurements and comparing each determined variation rate with a threshold value corresponding to a suspected removal of the integrated circuit package, and activating a warning signal if a variation rate exceeds the threshold value.

Some embodiments relate to an integrated circuit comprising a functional circuit sensitive to the mechanical stresses exerted on the integrated circuit, and a measuring circuit for measuring mechanical stresses configured to implement a control method like that described above.

According to one embodiment, the measuring circuit comprises a component sensitive to the mechanical stresses from which the measurement signal representative of mechanical stresses is generated.

According to one embodiment, the measuring circuit comprises a component having a low sensitivity to the mechanical stresses, and a component having a relatively higher sensitivity to the mechanical stresses, the components having comparable sensitivities to ambient temperature, the component having a low sensitivity to the mechanical stresses being used as a reference to avoid variations in the measurement signal in response to variations in the ambient temperature.

According to one embodiment, the component sensitive to the mechanical stresses is a MOS transistor with a square or rectangular gate, or a resistor formed of at least one N+- or P+-doped region in the same semiconductive material as the one in which the integrated circuit is formed, or even a resistor formed in an N+- or P+-doped polysilicon.

According to one embodiment, the component having a low sensitivity to the mechanical stresses is a transistor with an octagonal-shape annular gate enclosing the source or the drain of the transistor, or a resistor formed, in the semiconductive material of the integrated circuit, of branches connected in parallel, each branch comprising two elongated N+-doped regions connected in series and having respective orientations distanced by 30 to 60°.

According to one embodiment, the measuring circuit comprises two transistors, one being more sensitive to the mechanical stresses than the other, the measurement representative of the mechanical stresses exerted on the measuring circuit being derived from a voltage difference between terminals of each of the two transistors or from a difference in the current flowing through each of the two transistors.

According to one embodiment, the measuring circuit comprises an oscillator comprising components sensitive to mechanical stresses, and a frequency measuring circuit for measuring a frequency of an output signal of the oscillator, the frequency of the output signal being representative of the mechanical stresses exerted on the oscillator.

According to one embodiment, the measuring circuit comprises another oscillator formed exclusively of components slightly sensitive to the mechanical stresses, the measurement representative of mechanical stresses being determined from a difference in frequency between the output frequencies of the two oscillators.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

The inventors have recognized that the electrical properties of certain components of a circuit, like certain transistors and certain resistors, change under the effect of variations in mechanical stresses exerted on the circuit. Such changes in electrical properties can thus alter the operating characteristics of certain circuits of the integrated circuit. The frequency of clock signals produced by clock circuits proves to be particularly sensitive to such variations. Now, the clock frequency of a circuit significantly influences its performances.

It is possible to consider producing a circuit such that it is largely insensitive to expected or predicted mechanical stresses. However, it is difficult to anticipate the changes in mechanical stresses on a circuit throughout the lifetime of the circuit, and to anticipate all the effects of those mechanical stresses, and the changes to the same.

It may therefore be desirable to detect variations in mechanical stresses exerted on an integrated circuit as they occur. It may further be desirable to compensate for the effects of those variations in stresses on the performances of the integrated circuit, to limit differences in performances of the circuit compared to optimum performances. It may also be desirable to detect and indicate whether the mechanical stresses exerted on a circuit are excessive, or are indicative of tampering with the integrated circuit.

Figure 1A:
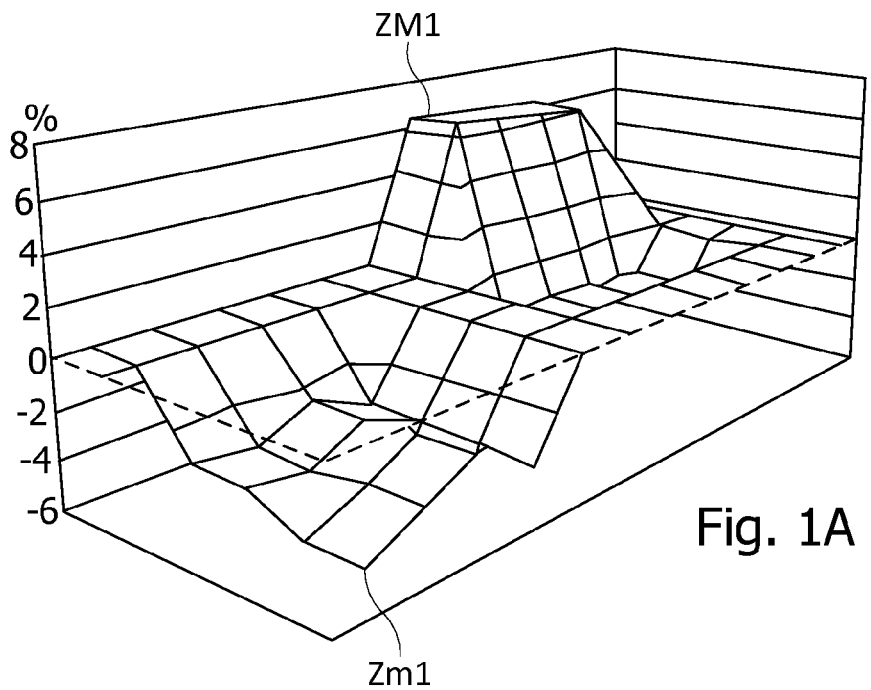
FIGS. 1A and 1B represent layers of distribution of the intensity of mechanical stresses on the surface of an integrated circuit, FIG. 2 schematically represents an integrated circuit equipped with one or more measuring circuits for measuring mechanical stresses, according to one embodiment, FIG. 3 schematically represents an operational circuit for using the measurements of mechanical stresses supplied by one of the measuring circuits in FIG. 2, according to one embodiment.
Figure 1B:
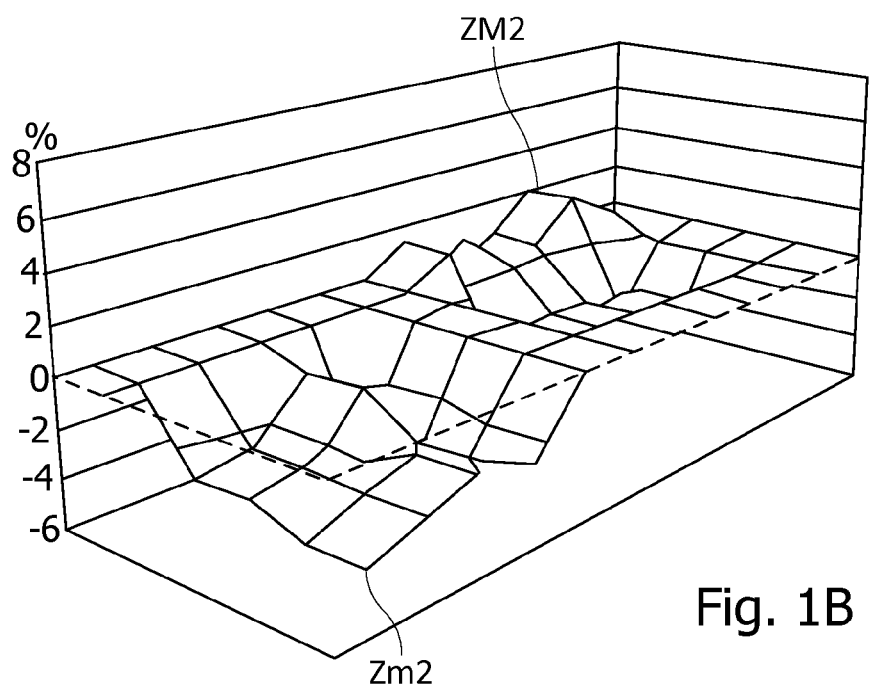

FIGS. 1A, 1B represent layers of distribution of the intensity of the effects of mechanical stresses on an integrated circuit along one of its surfaces. The effects of the mechanical stresses on an integrated circuit can be represented by the mobility of the electrons/holes in the semiconductive material of the integrated circuit. It transpires that the application of mechanical stresses on an integrated circuit affects the mobility of the electrons/holes in the semiconductive material of the integrated circuit. The layers in FIGS. 1A, 1B were obtained with the same integrated circuit at different moments, for example spaced out by several years, or before and after processing such as an annealing process. The layers represented in FIGS. 1A, 1B show that the mobility of the electrons/holes is not regular over the entire surface of the integrated circuit, and depends on the mechanical stresses exerted on the circuit. Therefore, the circuit comprises zones Zm1, Zm2 where the mobility of the electrons/holes is minimum and zones ZM1, ZM2 where this mobility is maximum. In the zones Zm1, Zm2, particularly, the integrated circuit undergoes compression. In the zones ZM1, ZM2, particularly, the integrated circuit undergoes a tension. The difference between the maximum and minimum values of the mobility of the electrons/holes can reach approximately ten percent in FIG. 1A and approximately 5 percent in FIG. 1B. The result is that the mechanical stresses exerted on an integrated circuit change over time and according to the ambient conditions (particularly temperature) to which the integrated circuit is subjected.

Figure 2:
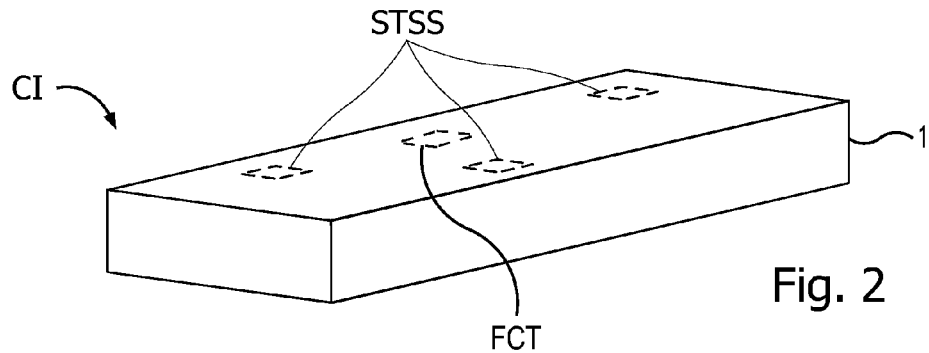

FIG. 2 represents an integrated circuit CI integrated in a semiconductor substrate 1. According to one embodiment, the integrated circuit CI comprises a functional circuit FCT and one or more measuring circuits STSS to measure the effects of mechanical stresses exerted on the integrated circuit in the zone where the measuring circuit is located. Each measuring circuit can be arranged near the functional circuit FCT, the operation of which is sensitive to mechanical stresses, and for which it is desirable to apply a correction, so as to reduce the impact of a variation in mechanical stresses on the operation of this sensitive functional circuit FCT. This correction can involve changing an operating parameter of this sensitive function circuit FCT.

Figure 3:
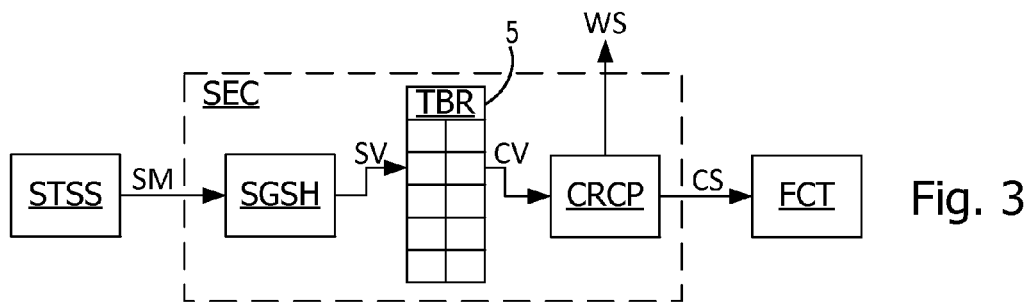

FIG. 3 represents an operational circuit SEC for using measurements representative of mechanical stresses, supplied by the measuring circuit STSS, according to one embodiment. The circuit SEC comprises a storage device 5 that stores a table TBR associating measurement values representative of mechanical stresses with possible values CV of an operating parameter of the functional circuit FCT of the integrated circuit CI, sensitive to the mechanical stresses. The circuit FCT is said to be "functional" insofar as it fulfills a function for which the integrated circuit was designed and produced. Each value CV of the operating parameter, associated in the table TBR with a measurement value, is determined to reduce the impact of mechanical stresses characterized by the measurement value, on the operation of the circuit FCT.

The circuit SEC may also comprise a conversion circuit SGSH for converting the measurements representative of mechanical stresses SM supplied by the circuit STSS into a value SV likely to address a value of the table TBR. The circuit SEC may also comprise a conversion circuit CRCP for converting each value CV addressed in the table TBR into a correction signal CS likely to be supplied to the circuit FCT to reduce the impact of the mechanical stresses on the operation of the circuit FCT. The circuit CRCP can also be configured to activate an error signal WS when a measurement SM supplied by the circuit STSS is above or below the representative mechanical stress values taken into account by the table TBR. Therefore, the signal WS indicates whether the integrated circuit leaves an optimum operating range.

The circuit CRCP can also be configured to perform an interpolation calculation, to determine the correction value CV, if a measurement SM is between two successive values representative of mechanical stresses of the table TBR.

In one embodiment, the content of the table TBR can be determined for a single integrated circuit, during a phase of calibrating the integrated circuit. The table TBR can also be determined for a production line of the integrated circuit. In this case, all the tables TBR of the integrated circuits coming from the production line are identical.

A mechanical stress can be characterized not only by an amplitude, but also by a direction of application. Furthermore, a circuit of the integrated circuit CI may be sensitive to mechanical stresses in a single direction of application only or in two perpendicular directions of application, for example longitudinal and transversal. The measuring circuit STSS can be selected according to the directions of the mechanical stresses to be measured. Therefore, if the mechanical stresses are to be measured in a single direction, the measuring circuit STSS can be configured and arranged so as to detect only the mechanical stresses exerted in that direction. For this purpose, the measuring circuit STSS may comprise only components sensitive to the mechanical stresses having only the direction of the mechanical stresses to be measured.

If the mechanical stresses are to be measured in all the directions in the plane of the surface of the integrated circuit, the measuring circuit STSS may comprise components sensitive to the mechanical stresses irrespective of the direction of those stresses. The measuring circuit STSS may also comprise components sensitive to the mechanical stresses in a single direction, these components being arranged in two different directions to supply two measurements representative of mechanical stresses exerted along two different axes (for example along the longitudinal axis and the transversal axis of the circuit). Each of the two measurements SM is converted into a correction value CV to be applied to an operating parameter of the circuit FCT, for example using a respective table such as the table TBR. The operating parameter of the circuit FCT to be adapted according to the measurement can be different according to the direction of application of the mechanical stress. If it is different, each of the two correction values is used to adapt a corresponding parameter. If the operating parameter to be adapted is the same whatever the direction of application of mechanical stresses, the correction to be applied to this operating parameter can be calculated by a weighted sum of the two correction values. The coefficients of the weighted sum can be determined according to the contribution of each direction of mechanical stress to the disturbance of the operation of the circuit FCT.

The circuit FCT can be a clock circuit receiving a setpoint frequency value that is corrected by the circuit SEC. The circuit FCT can also be a sense amplifier, for example of a Flash or EEPROM memory. The circuit FCT can also be a reference voltage generator such as a band gap generator. The correction signal can be a voltage or a frequency. The correction of the circuit FCT according to a mechanical stress measurement can also involve adjusting the supply voltage of the circuit FCT.

Figures 4A, 4B:
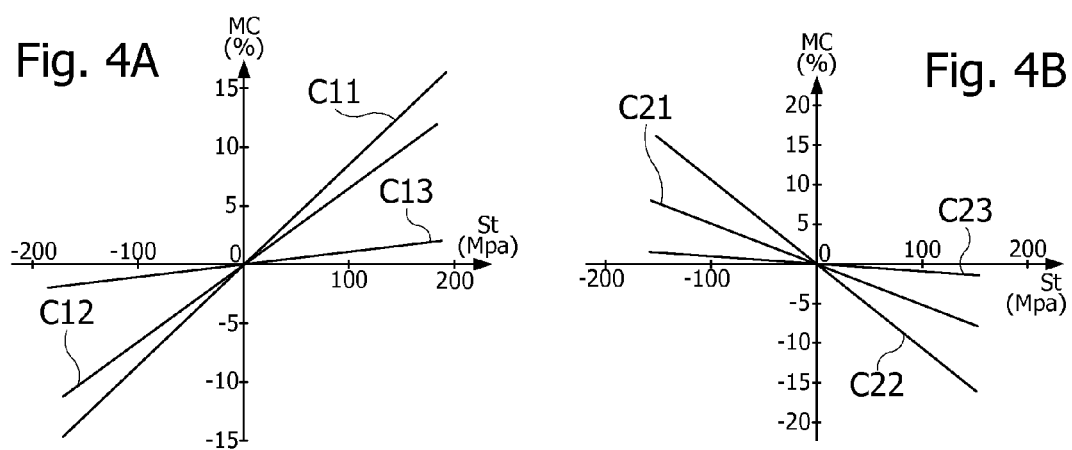
FIGS. 4A and 4B represent curves of electron/hole mobility variation in different types of transistors, according to mechanical stresses exerted on the transistors, FIGS. 5 to 7 schematically represent measuring circuits for measuring mechanical stresses, according to various embodiments, FIGS. 8 to 10 schematically represent a circuit of the measuring circuit in FIG. 7, according to various embodiments.
Figure 11A:
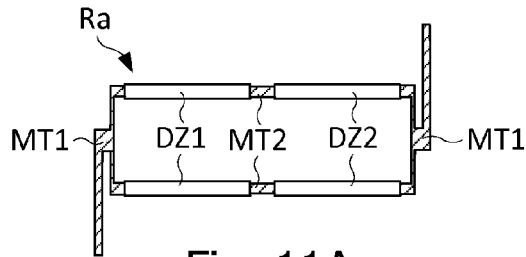
FIGS. 11A to 11D represent different configurations of resistors formed by doped zones in a semiconductive material.
Figure 11B:
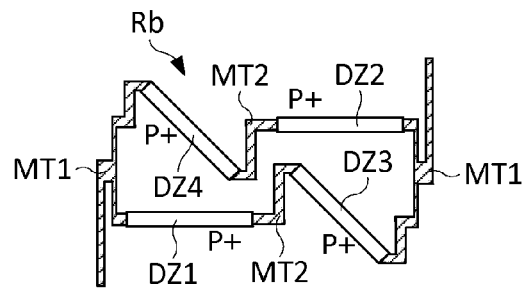
Figure 11C:
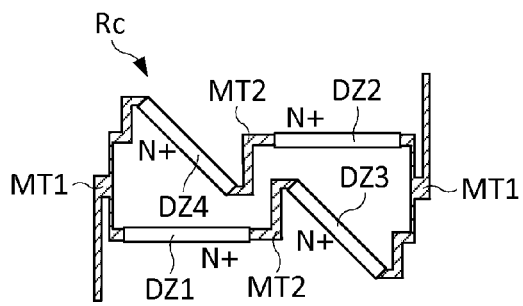
Figure 11D:
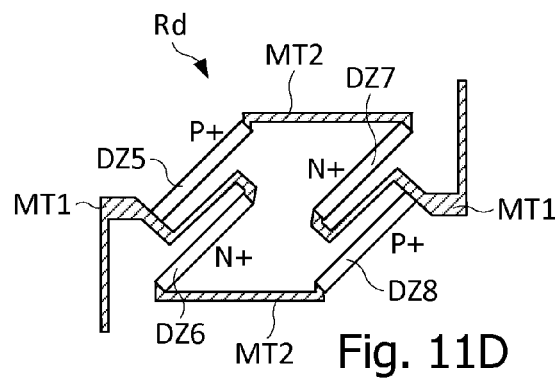

FIGS. 4A, 4B represent curves of relative electron/hole mobility variation C11-C13 and C21-C23 in different types of MOS transistors, according to the mechanical stresses exerted on the semiconductive material in which the transistors are formed. The mechanical stresses are expressed in MPa, and the relative electron/hole mobility variations are expressed as a percentage. The curves C11, C12, C13 in FIG. 4A were obtained with N-channel transistors. The curves C21, C22, C23 in FIG. 4B were obtained with P-channel transistors. The curves C11 and C21 were obtained with transistors having gates that are substantially square of approximately 10×10 μm (within about 10%). The curves C12 and C22 were obtained with transistors having gates that are substantially rectangular of about 10×0.38 μm (within about 10%), the mechanical stresses being applied longitudinally. The curves C13 and C23 were obtained with transistors with octagonal-shape annular gates, enclosing the source or the drain of the transistor, each gate having a width substantially equal to 0.38 μm (within about 10%), the width of the octagonal shape being substantially equal to 10 μm (within about 10%).

The curves C11-C13 and C21-C23 all have substantially the shape of straight lines (passing through the origin of the coordinates). The curves C11 to C13 have a positive slope, whereas the curves C21 to C23 have a negative slope. The curves C13 and C23 show that the transistors with an octagonal annular N- or P-channel gate are almost insensitive to the mechanical stresses they undergo (variation in the mobility of the electrons/holes lower than 2% between + and −150 MPa). By comparison, the curves C11 and C21 show that the square-gate transistors have, at mechanical stresses between + and −150 MPa, electron/hole mobility variations ranging between approximately + and −10% for the N-channel transistors, and between approximately + and −17% for the P-channel transistors. The curves C12 and C22 show that the oblong rectangular-gate transistors have, at mechanical stresses between + and −150 MPa, electron/hole mobility variations ranging between approximately + and −13% for the N-channel transistors, and between approximately + and −8% for the P-channel transistors.

FIGS. 5 to 7 schematically represent measuring circuits for measuring mechanical stresses STSS, STS1, STS2, according to various embodiments. The circuits STSS, STS1, STS2 use the different sensitivities to the mechanical stresses of the MOS transistors used to trace the curves C11-C13 and C21-C23. FIGS. 5 and 6 represent circuits with two N-channel MOS transistors M1, M2, one (M1) being sensitive to mechanical stresses, such as a square-gate SG or oblong rectangular-gate LG transistor, and the other (M2) being comparatively insensitive to the mechanical stresses, such as a transistor with an octagonal annular gate OG.

In FIG. 5, the circuit STSS comprises a voltage source Vd connected between the drain and the source of the transistors M1, M2, and a voltage source Vg connected between the gate and the drain or the source of the transistors M1, M2. The voltage sources Vd and Vg supply substantially constant voltages. The effect of the mechanical stresses on the circuit STSS can be assessed by comparing the drain currents Id1, Id2 of the transistors M1, M2, given that the threshold voltage of the transistors M1, M2 does not vary according to the mechanical stresses exerted on the latter. In other words, the effect of the mechanical stresses exerted on the circuit STSS varies according to the difference Id1-Id2 between the drain currents Id1, Id2 of the transistors M1, M2.

In FIG. 6, the circuit STS1 comprises only the voltage source Vd connected between the drain and the source of the transistors M1, M2. The effect of the mechanical stresses on the circuit STS1 can be assessed by comparing the gate voltages Vg1, Vg2 of the transistors M1, M2. The effect of the mechanical stresses exerted on the circuit STS1 varies according to the difference Vg1 -Vg2 between the gate voltages Vg1, Vg2 of the transistors M1, M2.

The circuit SGSH can then be configured to convert the current Id1-Id2 or voltage Vg1-Vg2 intensity differences into a value, for example numerical, likely to address the table TBR, or likely to correspond to the values representative of mechanical stresses stored in the table TBR. If the transistor M1 in FIGS. 5 and 6 has a rectangular gate LG, it can be formed in the integrated circuit IC so as to be oriented in a direction in which the mechanical stresses are to be detected and measured.

FIG. 7 represents the circuit STS2. The circuit STS2 comprises a ring oscillator comprising a NOR-type logic gate NG1 connected at output to an output S of the circuit STS2, and to a first unit UNC1 of a set of units UNC1-UNCn connected in series. The set of units comprises a last unit UNCn connected at output to an input of the gate NG1. The gate NG1 also receives at input an enabling signal EN at the logic state 1 when the circuit STS2 is off, and at the logic state 0 when the circuit STS2 is on. The output S of the circuit STS2 in the active state supplies a square signal at a certain frequency when the signal EN is inactive.

The units UNC1-UNCn may be simple inverters, as represented in FIG. 8. Therefore, FIG. 8 represents a circuit UNC corresponding to one embodiment of the units UNC1-UNCn. The circuit UNC comprises two MOS transistors, one P-channel referenced P11, and one N-channel referenced N11, mounted in series between a supply voltage source and the ground. The input of the circuit UNC is connected to the gates of the transistors P11, N11. The output of the circuit UNC is connected to the drains of the transistors P11, N11. One of the transistors P11, N11 is selected so as to be insensitive to the mechanical stresses, such as a transistor with an octagonal annular gate, while the other transistor P11, N11 is selected so as to be sensitive to the mechanical stresses such as a square- or oblong rectangular-gate transistor. The result is that the frequency of the output signal of the circuit STS2 varies according to the mechanical stresses exerted on the circuit STS2. The circuit SGSH can then be configured to measure the frequency of the output signal of the circuit STS2, and to convert the frequency measurement obtained into a value likely to address the table TBR or likely to correspond to the values representative of mechanical stresses stored in the table TBR.

FIGS. 9 and 10 each represent another embodiment UNCN, UNCP of the circuits UNC1-UNCn. The circuits UNCN and UNCP each comprise the inverter formed of the transistors P11, N11, mounted in series, and the gate of which is connected to the input of the circuit UNCN, UNCP.

In the circuit UNCN (FIG. 9), the drains of the transistors P11, N11 are connected to a gate of a P-channel MOS transistor P13, and to a source of an N-channel MOS transistor N12. The source and the drain of the transistor P13 are connected to the supply voltage source. The circuit UNCN also comprises a P-channel MOS transistor P12 comprising a gate connected to the input of the circuit UNCN and to the gate of the transistor N12, a source connected to the supply voltage source and a drain connected to the drain of the transistor N12 and to the output of the circuit UNCN. The transistors N11 and P13 can be configured to be sensitive to the mechanical stresses exerted on the circuit STS2, while the other transistors of the circuit UNCN are insensitive to the mechanical stresses. The sensitivity of the circuit STS2 to the mechanical stresses can be increased by configuring the gate of the transistor P13 for example in the shape of a comb with several parallel prongs.

In the circuit UNCP (FIG. 10), the drains of the transistors P11, N11 are connected to a gate of an N-channel MOS transistor N13, and to a source of a P-channel MOS transistor P14. The source and the drain of the transistor N13 are connected to the ground. The circuit UNCP also comprises an N-channel MOS transistor N14 comprising a gate connected to the input of the circuit UNCP and to the gate of the transistor P14, a source connected to the ground and a drain connected to the drain of the transistor P14 and to the output of the circuit UNCP. The transistors P11 and N 13 can be configured to be sensitive to the mechanical stresses exerted on the circuit STS2, while the other transistors of the circuit UNCP are insensitive to the mechanical stresses. The sensitivity of the circuit STS2 to the mechanical stresses can be increased by configuring the gate of the transistor N13 for example in the shape of a comb with several parallel prongs.

To avoid other effects such as variations in ambient temperature, the circuit STS2 may comprise a second oscillator as represented in FIG. 7, in which all the transistors are insensitive to the mechanical stresses, but sensitive to the temperature variations in the same way as the transistors sensitive to the mechanical stresses. Therefore, all the transistors of the second oscillator may for example comprise an octagonal annular gate. In this case, the measurement representative of mechanical stresses is obtained by calculating a frequency difference between the output frequencies of the two oscillators of the circuit STS2.

Instead of using MOS transistors as components sensitive to the mechanical stresses, it is also possible to use resistors formed by N+- or P+-doped semiconductor zones or polysilicon zones. Indeed, it transpires that the sensitivity of N+ and P+ resistors to the mechanical stresses depends on their configuration.

FIGS. 11A to 11D represent different configurations of resistors Ra, Rb, Rc, Rd formed by N+- and/or P+-doped zones. The resistors Ra to Rd are formed by doped zones DZ1-DZ linked to each other by electrically conductive paths MT1, MT2. In the examples in FIGS. 11A to 11D, the resistors Ra to Rd comprise two branches connected in parallel by paths MT1, each branch comprising two doped zones DZ1 and DZ2, DZ1 and DZ3, DZ2 and DZ4, DZ5 and DZ7, DZ6 and DZ8, of rectangular shape, connected in series by a path MT2.

In the resistor Ra (FIG. 11A), the doped zones DZ1, DZ2 connected in series in each branch of the resistor are aligned, and the doped zones DZ1, DZ2 of the two branches of the resistor Ra are parallel to each other. The doped zones DZ1, DZ2 all have the same N+ or P+ doping.

In the resistor Rb (FIG. 11B), the doped zones DZ1 and DZ3, DZ2 and DZ4 of each branch have different orientations. Therefore, in each branch, a first doped zone DZ1, DZ2 is oriented along a branch axis and a second doped zone DZ 3, DZ4 has an orientation forming an angle of between 30 and 60°, for example equal to 45°, with the orientation of the first doped zone of the branch. All the zones DZ1 to DZ4 are P+ doped.

The resistor Rc (FIG. 11C) is identical to the resistor Rb, except that the zones DZ1 to DZ4 are N+ doped.

In the resistor Rd (FIG. 11D), each branch comprises a P+-doped zone DZ5, DZ8 and an N+-doped zone DZ6, DZ7, and all the doped zones DZ5-DZ8 have a same orientation between 30 and 60°, for example equal to 45° compared to a branch axis.

Figure 12:
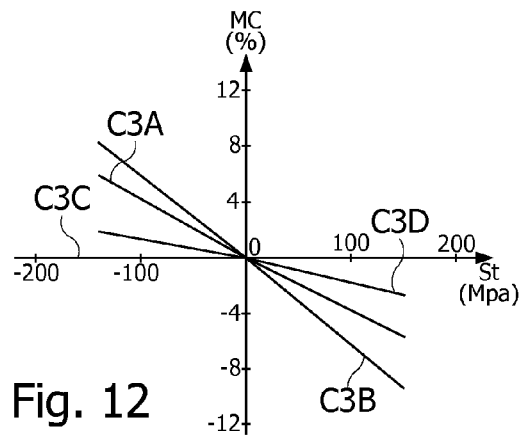
FIG. 12 represents curves of electron/hole mobility variation in the resistors represented in FIGS. 11A to 11D, according to mechanical stresses exerted on the resistors.

FIG. 12 represents curves C3A to C3D of electron/hole mobility variation in the resistors Ra to Rd, according to the mechanical stresses exerted on the semiconductive material forming the resistors. The curves C3A to C3D are substantially straight lines (passing through the origin of the coordinates) with a negative slope.

The curve C3A corresponds to the configuration of resistor Ra, when the zones DZ1, DZ2 are P+ doped. The curve C3A shows that the mobility of the electrons/holes in the resistor varies between approximately + and −6%, when the mechanical stress exerted on the resistor varies between + and −150 MPa.

The curve C3B corresponds to the resistor configuration Rb. The curve C3B shows that the mobility of the electrons/holes in the resistor varies between approximately + and −9%, when the mechanical stress exerted on the resistor varies between + and −150 MPa.

The curve C3C corresponds to the configuration of resistor Rc. The curve C3C shows that the mobility of the electrons/holes in the resistor does not vary, when the mechanical stress exerted on the resistor varies between + and −150 MPa.

The curve C3D corresponds to the configuration of resistor Rd. The curve C3D shows that the mobility of the electrons/ holes in the resistor varies between approximately + and −3%, when the mechanical stress exerted on the resistor varies between + and −150 MPa.

As the resistor Rb is insensitive to the mechanical stresses, it can be used as reference resistor for a measurement representative of mechanical stress. One or other of the resistors Ra, Rc, and possibly Rd, can be used as resistor sensitive to the mechanical stresses.

The resistor configurations in FIGS. 11A to 11D offer the advantage of being more sensitive to the mechanical stresses, while being insensitive to the variations in temperature. It will be understood that it is possible to use as the element sensitive to the mechanical stresses a simple, appropriately doped silicon rod oriented according to the mechanical stresses to be detected. To avoid the variations in temperature, a second, identical doped rod can be used but that is oriented so as to be insensitive to the mechanical stresses.

Figure 13A:
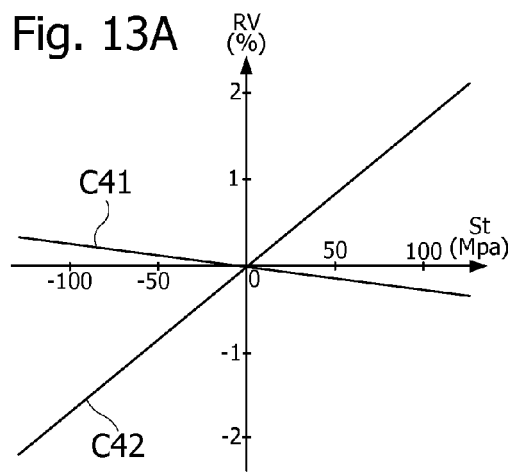
FIGS. 13A and 13B represent variation curves showing the relative variation in the values of resistors made of polysilicon, according to mechanical stresses exerted on the resistors, FIG. 14 schematically represents a measuring circuit for measuring mechanical stresses, according to another embodiment.
Figure 13B:
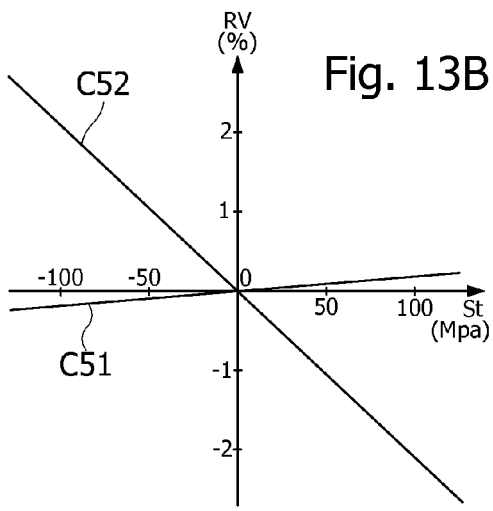

FIGS. 13A and 13B represent variation curves indicating the relative variation in the values of elongated resistors made of polysilicon, that are rectangular for example, according to mechanical stresses exerted on the resistor. The curves C41, C42 in FIG. 13A were obtained with resistors made of P+ polysilicon. The curve C41 was obtained by exerting transversal mechanical stresses on the resistor, and the curve C42 by exerting longitudinal mechanical stresses. The curve C41 shows that the value of the resistor varies between approximately + and −0.3%, when the mechanical stress exerted on the resistor varies between + and −150 MPa, with a negative slope. The curve C42 shows that the value of the resistor varies between approximately + and −1.6%, when the mechanical stress exerted on the resistor varies between + and −150 MPa, with a positive slope.

The curves C51, C52 in FIG. 13B were obtained with resistors made of N+ polysilicon. The curve C51 was obtained by exerting transversal mechanical stresses on the resistor, and the curve C52, by exerting longitudinal mechanical stresses. The curve C51 shows that the value of the resistor varies between approximately + and −0.2%, when the mechanical stress exerted on the resistor varies between + and −150 MPa, with a positive slope. The curve C52 shows that the value of the resistor varies between approximately + and −2.2%, when the mechanical stress exerted on the resistor varies between + and −150 MPa, with a negative slope.

It can be noted that the curves in FIGS. 13A, 13B have inverted slopes, and thus that the impact of mechanical stresses can be offset between resistors made of P+ and N+ polysilicon. The result is that the circuit formed of two rods connected in series, one being made of P+ polysilicon and the other made of N+ polysilicon, has a low sensitivity to the longitudinal mechanical stresses and can thus be used as reference resistor to measure the effects of such mechanical stresses, while avoiding the variations in ambient temperature.

Furthermore, it can further be observed that the effects of variations in temperature can also be virtually cancelled by connecting P+ and N+-doped resistors in series. The resistor Rd (FIG. 11D) can thus also be used as the reference to avoid the variations in ambient temperature.

Figure 14:
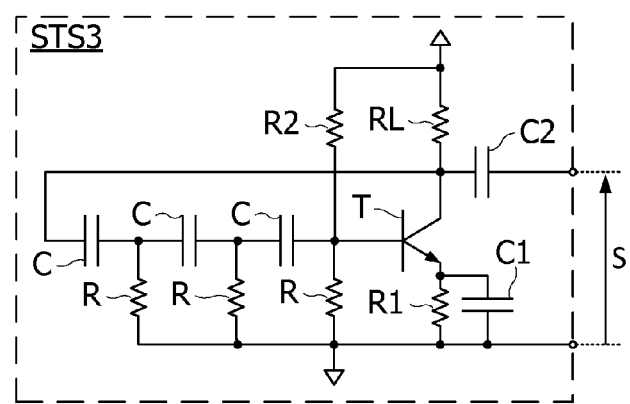

FIG. 14 represents a measuring circuit STS3 for measuring the effect of mechanical stresses, according to another embodiment. The circuit STS3 uses the sensitivity to the mechanical stresses of the resistors formed by doped zones (FIGS. 11A-11C and 12), or made of polysilicon (FIGS. 13A, 13B). The circuit STS3 comprises an oscillating RC circuit, with several RC stages (three in the example in FIG. 14) connected in series. Each RC stage comprises a capacitor C and a resistor in parallel, connected between a terminal of the capacitor and the ground. The connecting node between the capacitor C and the resistor R of a last of the RC stages is connected to the base of a bipolar transistor T. The base of the transistor T is also linked to a supply voltage source of the circuit STS3 through a resistor R2. The collector of the transistor T is connected to the capacitor C of a first of the RC stages, and is linked to a supply voltage source of the circuit, through a resistor RL, and to an output of the circuit STS3 through a capacitor C2. The emitter of the transistor T is linked to the ground through a resistor R1 in parallel with a capacitor C1. The frequency f of the output signal of the circuit STS3 can be classically calculated using the following equation:

$$f = \frac{1}{2\pi RC\sqrt{2N}} \quad (1)$$

where N is the number of RC stages, R and C being the values of the resistor R and of the capacitor C of each RC stage. The resistor R of each RC stage is configured so as to be sensitive to the mechanical stresses to be detected. The other resistors R1, R2, RL are configured so as to be virtually insensitive to the mechanical stresses to be detected. The circuit SGSH can then be configured to measure the frequency of the output signal of the circuit STS3, and to convert the frequency measurements obtained into values likely to address the table TBR.

To avoid other effects such as variations in ambient temperature, the circuit STS3 may comprise two oscillating RC circuits, as represented in FIG. 14. In the first oscillating circuit, only the resistors R are sensitive to the mechanical stresses. In the second oscillating circuit, all the components are insensitive to the mechanical stresses, but sensitive to the variations in temperature in the same way as the resistors sensitive to the mechanical stresses present in the first oscillating circuit. In this case, the measurement representative of mechanical stresses is obtained by calculating a difference in frequency between the output frequencies of the two oscillating circuits of the circuit STS3.

The measurements representative of stresses can be used for purposes other than correcting a parameter of a functional circuit of the integrated circuit. For example, such measurements can be used to detect an attack of the integrated circuit, i.e., to detect the removal of the integrated circuit package. For this purpose, a variation rate between two measurements representative of mechanical stresses exerted on the integrated circuit can be calculated periodically or upon each measurement, so as to detect a fast variation in these mechanical stresses. If the measurement values supplied by the measuring circuit STSS (or STS1 -STS3) change with a variation rate greater than a threshold value, a warning signal can be activated. The activated warning signal can be used to take any appropriate measure to protect the integrated circuit, such as blocking or resetting the integrated circuit, or erasing any memories and registers of the integrated circuit, etc.

It will be understood by those skilled in the art that various alternative embodiments and various applications of the present disclosure are possible. In particular, the present disclosure is not limited to the components sensitive to the mechanical stresses previously described, but can be implemented with other components, provided that one or more of their electrical properties are changed under the effect of such mechanical stresses. Therefore, the measuring circuit enabling these changes to electrical properties to be used is not limited to those previously described. Indeed, the measuring circuit depends on the electrical property changed and thus to be measured to obtain a measurement representative of the mechanical stresses exerted on the component.

The correction to be applied to the functional circuit is not necessarily determined using a table of correspondence such as the table TBR, but can be determined by other means such as the implementation of a mathematical formula depending on the electrical property measured and on the nature of the correction to be applied to the functional circuit.

The comparison of each measurement with extreme values is not necessary either. Indeed, this comparison depends on the law of variation of an output signal of the functional circuit, or more generally of variation in the electrical behavior of the functional circuit, according to the mechanical stresses it undergoes. Therefore, it is possible for the functional circuit to become insensitive to the mechanical stresses when the latter exceed certain thresholds, so that the correction to be applied remains constant above a certain threshold.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a functional electronic circuit of an integrated circuit integrated in a semiconductor substrate; and
   forming in the semiconductor substrate a measuring circuit of the integrated circuit, the measuring circuit being sensitive to mechanical stresses exerted on the semiconductor substrate and being configured to produce a measurement signal representative of the mechanical stresses exerted on the semiconductor substrate, the measuring circuit including a MOS transistor with a rectangular gate, the MOS transistor being sensitive to the mechanical stresses and configured to generate the measurement signal.

2. The method according to claim 1, wherein forming the measuring circuit includes:
   forming measuring components of the measuring circuit having different sensitivities to the mechanical stresses and comparable sensitivities to variations in ambient temperature, the measuring components being configured to provide respective measurements of the mechanical stresses; and
   forming a comparison component of the measuring circuit, the comparison component being configured to compare the respective measurements and supply the measurement signal representative of the mechanical stresses based on comparing the respective measurements.

3. A method, comprising:
   obtaining a measurement signal representative of mechanical stresses exerted on a measuring circuit of an integrated circuit formed in a semiconductor substrate, the measuring circuit being in a position of the integrated circuit such that the measurement signal is also representative of mechanical stresses exerted on a functional circuit of the integrated circuit,
   determining from the measurement signal a value of a parameter of the functional circuit;
   supplying the functional circuit with the value of the parameter; and
   comparing a value of the measurement signal with extreme values, and
   if the value of the measurement signal is not between the extreme values, activating a warning signal.

4. The method according to claim 3, comprising selecting from a table the value of the parameter, according to the measurement signal.

5. The method according to claim 4, comprising converting the measurement signal into a value that is used to address the table.

6. The method according to claim 3, comprising
   obtaining first and second measurements of the mechanical stresses;
   determining a variation rate between the first and second measurements;
   comparing the variation rate with a threshold value corresponding to a removal of the integrated circuit package; and
   activating a warning signal if a variation rate exceeds the threshold value.

7. The method according to claim 3, comprising mitigating, using the value of the parameter, an impact of the mechanical stresses on an operation of the functional circuit.

8. An integrated circuit integrated in a semiconductive substrate, the integrated circuit comprising:
   a functional circuit integrated in the semiconductive substrate and sensitive to mechanical stresses exerted on the integrated circuit; and
   a measuring circuit integrated in the semiconductive substrate and configured to produce a measurement signal representative of the mechanical stresses exerted on the integrated circuit, the measuring circuit including a MOS transistor with a rectangular gate, the MOS transistor being sensitive to the mechanical stresses and configured to generate the measurement signal.

9. The integrated circuit according to claim 8, wherein the measuring circuit comprises a first component, having a low sensitivity to the mechanical stresses, and a second component having a relatively higher sensitivity to the mechanical stresses and a sensitivity to ambient temperature comparable to that of the first component, the second component being configured to function as a reference to avoid variations in the measurement signal arising from variations in the ambient temperature.

10. The integrated circuit according to claim 9, wherein the second component is a MOS transistor with a square or rectangular gate, a resistor formed of at least one doped region in the semiconductive substrate, or a resistor formed in an N+-doped or P+-doped polysilicon layer.

11. The integrated circuit according to claim 9, wherein the first component includes a transistor with an octagonal-shape annular gate enclosing a source or drain of the transistor.

12. The integrated circuit according to claim 9, wherein the first component includes a resistor formed, in the semiconductive substrate, of branches connected in parallel, each branch including two elongated N+-doped regions connected in series and having respective orientations distanced by 30 to 60°.

13. The integrated circuit according to claim 8, wherein the measuring circuit comprises an additional transistor, the MOS transistor being more sensitive to the mechanical stresses than the additional transistor, the measurement signal representative of mechanical stresses exerted on the integrated circuit being derived from a difference in voltage across the MOS transistor and the additional transistor or from a difference in a current flowing through the MOS transistor and the additional transistor.

14. The integrated circuit according to claim 8, wherein the measuring circuit comprises:
an oscillator having components sensitive to the mechanical stresses, and
a frequency measuring circuit configured to measure a frequency of an output signal of the oscillator, the frequency of the output signal being representative of the mechanical stresses exerted on the integrated circuit.

15. The integrated circuit according to claim 14, wherein the measuring circuit comprises an additional oscillator formed of components substantially insensitive to the mechanical stresses, the measuring circuit being configured to produce the measurement signal representative of the mechanical stresses based on a difference in frequency between respective output frequencies of the oscillator and the additional oscillator.

16. A device, comprising:
a semiconductor substrate;
a functional circuit formed in the semiconductor substrate and configured to be variable, with respect to an operating parameter of the functional circuit, in response to variations in a control signal at a control signal input of the functional circuit; and
a measuring circuit configured to detect mechanical stresses exerted on the functional circuit, to determine a value of the control signal according to a value of the detected mechanical stresses, and to control, by selection of the value of the control signal, a variation of the operating parameter that is inversely related to a variation of the operating parameter provoked by a change in mechanical stresses exerted on the functional circuit.

17. The device of claim 16, wherein the measuring circuit is configured to control, by selection of the value of the control signal, a response of the functional circuit to the detected mechanical stresses.

18. The device of claim 16, wherein the measuring circuit is configured to substantially prevent, by selection of the value of the control signal, a response of the functional circuit to the detected mechanical stresses.

19. The device of claim 16, wherein the measuring circuit is configured to be substantially insensitive to variations in temperature of the microchip.

20. The device of claim 16, wherein the measuring circuit comprises:
a mechanical stress detection circuit configured to produce a stress signal representative of a value of the mechanical stresses; and
a signal selection circuit configured to correlate a value of the stress signal with a predicted response of the functional circuit to the mechanical stresses represented by the stress signal, and to produce a value of the control signal predicted to mitigate the predicted response.

21. The device of claim 16, wherein the measuring circuit is configured to differentiate between mechanical stresses exerted on the functional circuit along two different axes.

22. The device of claim 16, wherein the measuring circuit is configured to be substantially insensitive to mechanical stresses exerted on the functional circuit except stresses exerted along a selected axis.

23. A method, comprising:
obtaining a measurement signal representative of mechanical stresses exerted on a measuring circuit of an integrated circuit formed in a semiconductor substrate, the measuring circuit being in a position of the integrated circuit such that the measurement signal is also representative of mechanical stresses exerted on a functional circuit of the integrated circuit,
determining from the measurement signal a value of a parameter of the functional circuit;
supplying the functional circuit with the value of the parameter;
obtaining first and second measurements of the mechanical stresses;
determining a variation rate between the first and second measurements;
comparing the variation rate with a threshold value corresponding to a removal of the integrated circuit package; and
activating a warning signal if a variation rate exceeds the threshold value.

24. The method according to claim 23, comprising mitigating, using the value of the parameter, an impact of the mechanical stresses on an operation of the functional circuit.

25. An integrated circuit integrated in a semiconductive substrate, the integrated circuit comprising:
a functional circuit integrated in the semiconductive substrate and sensitive to mechanical stresses exerted on the integrated circuit; and
a measuring circuit integrated in the semiconductive substrate and configured to produce a measurement signal representative of the mechanical stresses exerted on the integrated circuit, the measuring circuit including:
a first component having a low sensitivity to the mechanical stresses, the first component including a transistor with an octagonal-shape annular gate enclosing a source or drain of the transistor, and
a second component having a relatively higher sensitivity to the mechanical stresses and a sensitivity to ambient temperature comparable to that of the first component, the second component being configured to function as a reference to avoid variations in the measurement signal arising from variations in the ambient temperature.

26. The integrated circuit according to claim 25, wherein the second component is a MOS transistor with a square or rectangular gate, a resistor formed of at least one doped region in the semiconductive substrate, or a resistor formed in an N+-doped or P+-doped polysilicon layer.

27. An integrated circuit integrated in a semiconductive substrate, the integrated circuit comprising:
a functional circuit integrated in the semiconductive substrate and sensitive to mechanical stresses exerted on the integrated circuit; and
a measuring circuit integrated in the semiconductive substrate and configured to produce a measurement signal representative of the mechanical stresses exerted on the integrated circuit, the measuring circuit including:
a first component having a low sensitivity to the mechanical stresses, the first component including a resistor formed, in the semiconductive substrate, of branches connected in parallel, each branch including two elongated N+-doped regions connected in series and having respective orientations distanced by 30 to 60°, and
a second component having a relatively higher sensitivity to the mechanical stresses and a sensitivity to ambient temperature comparable to that of the first component, the second component being configured to function as a reference to avoid variations in the measurement signal arising from variations in the ambient temperature.

28. The integrated circuit according to claim 27, wherein the second component is a MOS transistor with a square or rectangular gate, a resistor formed of at least one doped region in the semiconductive substrate, or a resistor formed in an N+-doped or P+-doped polysilicon layer.

29. An integrated circuit integrated in a semiconductive substrate, the integrated circuit comprising:
a functional circuit integrated in the semiconductive substrate and sensitive to mechanical stresses exerted on the integrated circuit; and
a measuring circuit integrated in the semiconductive substrate and configured to produce a measurement signal representative of the mechanical stresses exerted on the integrated circuit, the measuring circuit including two transistors, one being more sensitive to the mechanical stresses than the other, the measurement signal representative of mechanical stresses exerted on the integrated circuit being derived from a difference in voltage across the respective transistors or from a difference in a current flowing through the respective transistors.

30. The integrated circuit according to claim 29, wherein the two transistors have comparable sensitivities to variations in ambient temperature.

31. An integrated circuit integrated in a semiconductive substrate, the integrated circuit comprising:
a functional circuit integrated in the semiconductive substrate and sensitive to mechanical stresses exerted on the integrated circuit; and
a measuring circuit integrated in the semiconductive substrate and configured to produce a measurement signal representative of the mechanical stresses exerted on the integrated circuit, the measuring circuit including:
a first oscillator having components sensitive to the mechanical stresses,
a second oscillator formed of components substantially insensitive to the mechanical stresses,
a frequency measuring circuit configured to measure a frequency of an output signal of the first oscillator and a frequency of an output signal of the second oscillator, the frequency of the output signal of the first oscillator being representative of the mechanical stresses exerted on the integrated circuit, the measuring circuit being configured to produce the measurement signal representative of the mechanical stresses based on a difference in frequency between respective output frequencies of the first oscillator and the second oscillator.

32. The integrated circuit according to claim 31, wherein the first second oscillators have comparable sensitivities to variations in ambient temperature.

* * * * *